(12) United States Patent
Shin et al.

(10) Patent No.: US 11,568,917 B1
(45) Date of Patent: Jan. 31, 2023

(54) HAMMER REFRESH ROW ADDRESS DETECTOR, AND SEMICONDUCTOR MEMORY DEVICE AND MEMORY MODULE INCLUDING THE SAME

(71) Applicant: SAMSUNG ELECTRONICS CO., LTD., Suwon-si (KR)

(72) Inventors: Hoon Shin, Hwaseong-si (KR); Yeonhong Park, Seoul (KR); Jaewook Lee, Seoul (KR); Eojin Lee, Suwon-si (KR); Woosuk Kwon, Seoul (KR); Jungho Ahn, Seoul (KR); Taejun Ham, Seoul (KR)

(73) Assignees: Samsung Electronics Co., Ltd., Suwon-si (KR); Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 17/504,705

(22) Filed: Oct. 19, 2021

(30) Foreign Application Priority Data

Oct. 12, 2021 (KR) .................. 10-2021-0134781

(51) Int. Cl.
    *G11C 11/4078* (2006.01)
(52) U.S. Cl.
    CPC ................... *G11C 11/4078* (2013.01)
(58) Field of Classification Search
    CPC .................................. G11C 11/4078
    USPC .................................. 365/149
    See application file for complete search history.

(56) References Cited

U.S. PATENT DOCUMENTS

| | | | |
|---|---|---|---|
| 9,032,141 B2 | 5/2015 | Bains et al. | |
| 9,299,400 B2 | 3/2016 | Bains et al. | |
| 9,478,263 B2 | 10/2016 | Ni et al. | |
| 10,725,695 B2 | 7/2020 | Kim | |
| 10,832,792 B1* | 11/2020 | Penney | G11C 11/4078 |
| 10,885,966 B1 | 1/2021 | Devaux et al. | |
| 10,950,288 B2 | 3/2021 | Nale et al. | |
| 11,049,544 B2 | 6/2021 | Devaux et al. | |
| 11,054,995 B2 | 7/2021 | Schaefer et al. | |
| 2014/0095780 A1 | 4/2014 | Bains et al. | |
| 2014/0156923 A1 | 6/2014 | Bains et al. | |

(Continued)

OTHER PUBLICATIONS

Yeonhong Park, Graphene: Strong yet Lightweight Row Hammer Protection, 2020 53rd Annual IEEE/ACM International Symposium On Microarchitecture (Micro), Nov. 11, 2020, IEEE, Athens Greece.

*Primary Examiner* — Connie C Yoha
(74) *Attorney, Agent, or Firm* — Volentine, Whitt & Francos, PLLC

(57) ABSTRACT

A hammer refresh row address detector includes a control logic unit that receives a row address applied along with an active command, to increase a hit count stored in a corresponding entry when the row address is present in candidate aggressor row addresses stored in n entries. The control logic determines a candidate aggressor row address stored in an entry in which the hit count equals a threshold value to be a target aggressor row address. The control logic generates a victim row address adjacent to the target aggressor row address as a hammer refresh row address to accompany a hammer refresh command. The control logic increases the miss count value when the row address is not present in the candidate aggressor row addresses stored in the n entries and no hit count within the n entries is identical to the miss count value.

20 Claims, 12 Drawing Sheets

(56) References Cited

U.S. PATENT DOCUMENTS

| | | |
|---|---|---|
| 2015/0206558 A1 | 7/2015 | Ni et al. |
| 2019/0087127 A1 | 3/2019 | Kim |
| 2019/0228813 A1 | 7/2019 | Nale et al. |
| 2020/0081631 A1 | 3/2020 | Schaefer et al. |
| 2020/0388325 A1* | 12/2020 | Cowles ............... G11C 11/4087 |
| 2020/0388326 A1 | 12/2020 | He et al. |
| 2021/0012832 A1 | 1/2021 | Devaux et al. |
| 2021/0042185 A1 | 2/2021 | Rooney et al. |
| 2022/0293169 A1* | 9/2022 | Meier ............... G11C 11/40622 |

* cited by examiner

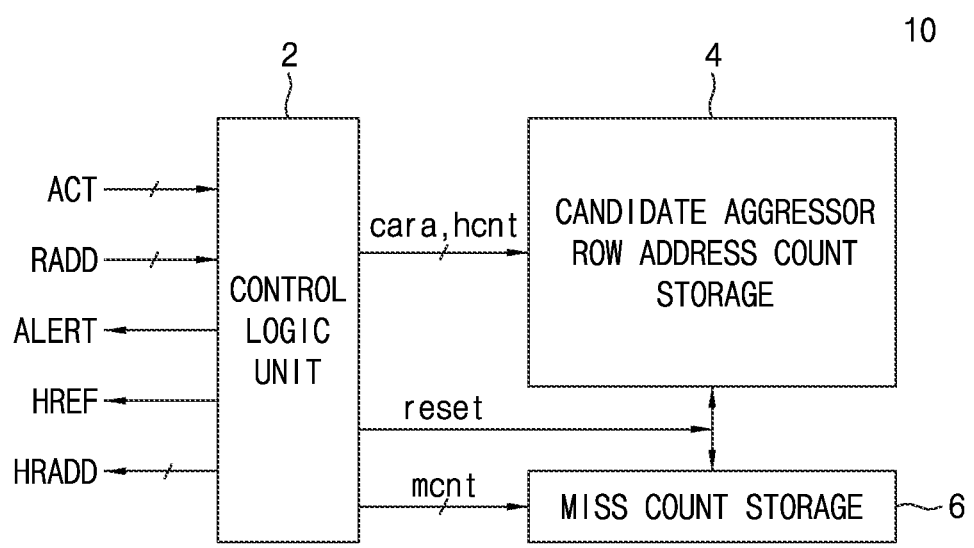

HAMMER REFRESH ROW ADDRESS DETECTOR, AND SEMICONDUCTOR MEMORY DEVICE AND MEMORY MODULE INCLUDING THE SAME

CROSS-REFERENCE TO THE RELATED APPLICATION

This application claims priority from Korean Patent Application No. 10-2021-0134781, filed on Oct. 12, 2021, in the Korean Intellectual Property Office, the disclosure of which is incorporated herein by reference in its entirety.

BACKGROUND

1. Field

The present disclosure relates to a hammer refresh row address detector and a semiconductor memory device and a memory module including the same.

2. Description of the Related Art

Row hammer attacks can pose a serious security threat to computing systems that use a dynamic random access memory (DRAM) device as a main memory. Row hammer attacks frequently access an aggressor row address to cause a loss of charge in DRAM cells of a victim row address adjacent to the aggressor row address, resulting in data loss.

A DRAM device may include a plurality of DRAM cells in a plurality of rows and perform a normal refresh operation every refresh period in order to maintain data stored in the DRAM cells of the plurality of rows. In addition, since data stored in DRAM cells of a victim row address adjacent to a frequently accessed aggressor row address may be lost faster than data stored in DRAM cells adjacent to a normally accessed row address, the DRAM device may additionally perform a hammer refresh operation on the DRAM cells of the victim row address.

SUMMARY

The exemplary embodiments of the disclosure provide a hammer refresh row address detector, capable of efficiently detecting a hammer refresh row address, and a semiconductor memory device and a memory module including the same.

The tasks of the embodiments according to the present disclosure are not limited to the tasks mentioned above and other tasks which are not mentioned will be clearly understood by those skilled in the art from the following description.

According to embodiments of the present disclosure, a hammer refresh row address detector may include a candidate aggressor row address count storage including n entries and configured to store a candidate aggressor row address and a hit count value corresponding to the candidate aggressor row address in each of the n entries. A miss count storage stores a miss count value. A control logic unit receives a row address applied along with an active command to: (1) increase the hit count value stored in a corresponding entry when the row address is present in the candidate aggressor row addresses stored in the n entries, (2) determine the candidate aggressor row address, stored in at least one entry in which the hit count value in the n entries is a threshold value, to be a target aggressor row address, (3) generate at least one victim row address adjacent to the target aggressor row address as a hammer refresh row address along with a hammer refresh command, and (4) increase the miss count value when the row address is not present in the candidate aggressor row addresses stored in the n entries and the hit count value identical to the miss count value is not present in the n entries.

According to embodiments of the present disclosure, a semiconductor memory device may include a command decoder and address generator configured to: (1) decode a command signal included in a command and address to generate an active command and (2) generate an address signal included in the command and address as a row address along with the active command. A hammer refresh row address detector: (1) receives the row address applied along with the active command to increase a hit count value stored in a corresponding entry when the row address is present in candidate aggressor row addresses stored in n entries, (2) determines the candidate aggressor row address stored in at least one entry in which the hit count value in the n entries is a threshold value to be a target aggressor row address, and (3) generates at least one victim row address adjacent to the target aggressor row address as a hammer refresh row address along with a hammer refresh command, and (4) increases the miss count value when the row address is not present in the candidate aggressor row addresses stored in the n entries and the hit count value identical to the miss count value is not present in the n entries. A row decoder decodes the hammer refresh row address in response to a hammer refresh command to generate a plurality of word line select signals. A memory cell array includes a plurality of memory cells connected to a plurality of word lines and performs a hammer refresh operation on memory cells connected to at least one word line selected from the plurality of word lines in response to the plurality of word line select signals.

According to embodiments of the present disclosure, a memory module may include a printed circuit board. A plurality of semiconductor memory devices is mounted on the printed circuit board, receives a clock signal and a command and address, and performs a hammer refresh operation when a command signal included in the command and address is a hammer refresh command and an address signal included in the command and address is a hammer refresh row address. A register clock driver is mounted on the printed circuit board, receives a module clock signal and a module command and address, and generates the clock signal and the command and address. The register clock driver may include an active command and row address detector configured to receive the module clock signal and the module command and address. When the command signal included in the module command and address is an active command, the command and row address detector generates the address signal included in the module command and address applied along with the active command as a driver row address. The register clock driver may include a hammer refresh row address detector configured to: (1) receive the driver row address applied along with the active command, (2) increase a hit count value stored in a corresponding entry when the driver row address is present in candidate aggressor row addresses stored in n entries, (3) determine the candidate aggressor row address stored in at least one entry in which the hit count value in the n entries is a threshold value to be a target aggressor row address, (4) generate at least one victim row address adjacent to the target aggressor row address as a hammer refresh row address along with a hammer refresh command, and (5) increase the miss count value when the row address is not present in the candidate aggressor row addresses stored in the n entries and the hit count value identical to the miss count value is not present in the n entries. The register clock driver may include a hammer refresh command and row address encoder configured to receive and encode the hammer refresh command and the hammer refresh row address to generate a driver command and address. The register clock driver may include a command and address generator configured to: (1) receive the module command and address in response to the module clock signal and generate the clock signal and the command and address or (2) receive the driver command and address and to generate the clock signal and the command and address.

BRIEF DESCRIPTION OF THE DRAWINGS

FIG. 1 is a block diagram showing a configuration of a hammer refresh row address detector of an embodiment according to the present disclosure.

FIG. 2 shows a structure of the candidate aggressor row address count storage of an embodiment according to the present disclosure.

DETAILED DESCRIPTION OF EXEMPLARY EMBODIMENTS

Figure 3A:
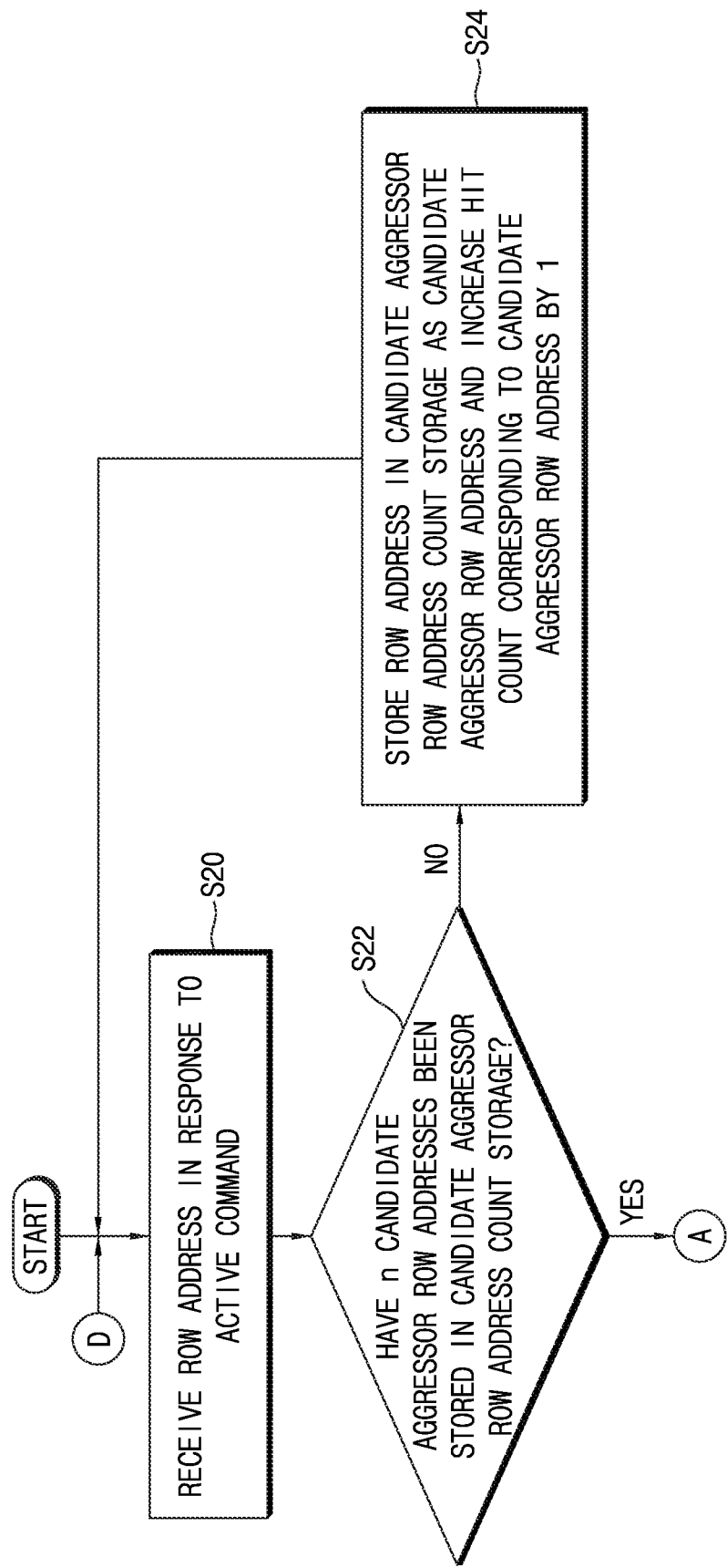
FIGS. 3A to 3D are flowcharts for describing the operation of the control logic unit of the hammer refresh row address detector according to the embodiment of the present disclosure.

Hereinafter, a hammer refresh row address detector and a semiconductor memory device and a memory module including the same according to embodiments of the present disclosure will be described with reference to the accompanying drawings.

FIG. 1 is a block diagram showing a configuration of a hammer refresh row address detector of an embodiment according to the present disclosure. The hammer refresh row address detector 10 includes a control logic unit 2, a candidate aggressor row address count storage 4, and a miss count storage 6.

A function of each block shown in FIG. 1 will be described as follows.

The control logic unit 2 may receive a row address RADD in response to an active command ACT; increase a hit count value "hcnt" stored in a corresponding entry, among a plurality of hit count values stored in a plurality of (e.g., n) entries, when the row address RADD is present in a plurality of candidate aggressor row addresses stored in the plurality of entries; increase a miss count value "mcnt" when the row address RADD is not present; determine a candidate aggressor row address stored in at least one entry, in which the hit count value hcnt in the plurality of entries is a threshold value, as a target aggressor row address; and generate at least one victim row address (the target aggressor row address ±1) adjacent to the target aggressor row address as a hammer refresh row address HRADD along with a hammer refresh command HREF. The control logic unit 2 may additionally generate a warning signal ALERT when a hit count value hcnt of a candidate aggressor row address "cara" is the threshold value. The control logic unit 2 may perform a hammer refresh row address detection operation and generate a reset signal "reset" during a reset window period.

The candidate aggressor row address count storage 4 may store a plurality of candidate aggressor row addresses and hit count values corresponding to the candidate aggressor row addresses in a plurality of entries. The candidate aggressor row address count storage 4 may be reset in response to the reset signal reset.

The miss count storage 6 may store a miss count value mcnt. The miss count storage 6 may be reset in response to the reset signal reset.

FIG. 2 shows a structure of the candidate aggressor row address count storage of an embodiment according to the present disclosure. The candidate aggressor row address count storage 4 stores n entries 1, 2, . . . , n, and each entry may include a corresponding candidate aggressor row address cara1, cara2, . . . , or caran stored in a candidate aggressor row address storage area "carar" and a hit count value hcnt1, hcnt2, . . . , or hcntn corresponding to the candidate aggressor row address cara1, cara2, . . . , or caran and stored in a hit count value storage area hcntr. The candidate aggressor row address counter storage 4 may be a register or a buffer.

In an embodiment, when the reset window period is P, the total number of active commands ACT that can be applied within the reset window P is W and the threshold value is T, the reset window period P may be set to less than tREFW if a time between two successive normal refresh operations for the same row address RADD is tREFW. If the reset window period P is 64 ms, the total number W of active commands ACT that can be applied within 64 ms is 100,000 and the threshold value T is 10,000, the number n of entries corresponding to the number of candidate aggressor row addresses that can be stored in the candidate aggressor row address count storage 4 may be a value greater than W/T−1 (=9), for example, 10. Here, assuming that an actual row hammer attack occurs when a row address RADD is applied more than a predetermined number of times TRH along with the active command ACT within the reset window period P, the threshold value T may be set to less than TRH. The number (i.e., n) of entries included in the candidate aggressor row address count storage 4 and the threshold value T may be variably set depending on the reset window period P.

Although not shown, the miss count storage 6 may also be a register or a buffer.

FIGS. 3A to 3D are flowcharts for describing the operation of the control logic unit of the hammer refresh row address detector according to the embodiment of the present disclosure.

Referring to FIG. 3A, a row address RADD is received in response to the active command ACT (S20). It is determined whether n candidate aggressor row addresses cara1 to caran are stored in n entries of the candidate aggressor row address count storage 4 (S22). That is, it is determined whether the candidate aggressor row address count storage 4 is full. If step S22 is not satisfied, the row address RADD is stored in the candidate aggressor row address count storage 4 as a candidate aggressor row address cara1, cara2, . . . , or caran, and a hit count value hcnt1, hcnt2, . . . , or hcntn corresponding to the row addresses cara1, cara2, . . . , or caran is increased by 1 (S24). After step S24, processing proceeds to step S20. That is, the control logic unit 2 may receive the row address RADD in response to the active command ACT and store n different candidate aggressor row addresses cara1 to caran in the n entries of the candidate aggressor row address count storage 4.

Figure 3B:
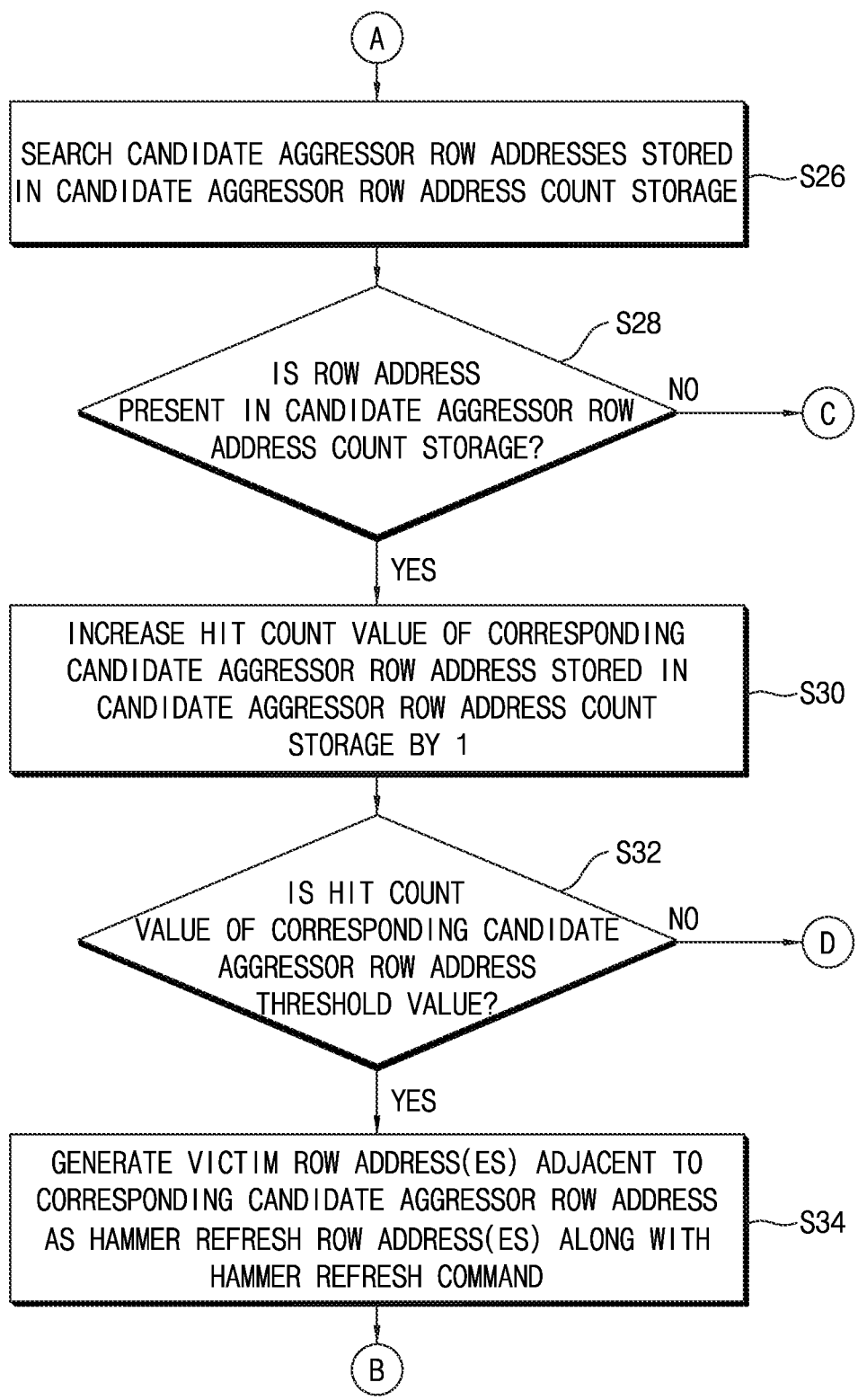

Referring to FIG. 3B, if step S22 is satisfied, the candidate aggressor row addresses cara1 to caran stored in the n entries of the candidate aggressor row address count storage 4 are searched (S26). It is determined whether the row address RADD is present in the candidate aggressor row address count storage 4 (S28). If step S28 is satisfied, a hit count value hcnt1, hcnt2, . . . , or hcntn of the corresponding candidate aggressor row address cara1, cara2, . . . , or caran stored in the candidate aggressor row address count storage 4 is increased by 1 (S30). It is determined whether the hit count value hcnt1, hcnt2, . . . , or hcntn of the corresponding candidate aggressor row address cara1, cara2, . . . , or caran is a threshold value (S32). If step S32 is satisfied, the corresponding candidate aggressor row address cara1, cara2, . . . , or caran is determined as a target aggressor row address and at least one victim row address adjacent to the target aggressor row address is generated as at least one hammer refresh row address HRADD along with a hammer refresh command HREF (S34). If step S32 is not satisfied, processing proceeds to step S20. That is, when the row address RADD is applied along with the active command ACT after step S24, the control logic unit 2 may perform a search as to whether a candidate aggressor row address cara1, cara2, . . . , or caran identical to the row address RADD is present in the candidate aggressor row addresses cara1 to caran, increase the corresponding hit count value hcnt1, hcnt2, . . . , or hcntn by 1 when it is present, and determine the corresponding candidate aggressor row address cara1, cara2, . . . or caran as a target aggressor row address when the corresponding hit count value hcnt1, hcnt2, . . . , hcntn reaches the threshold value.

Figure 3C:
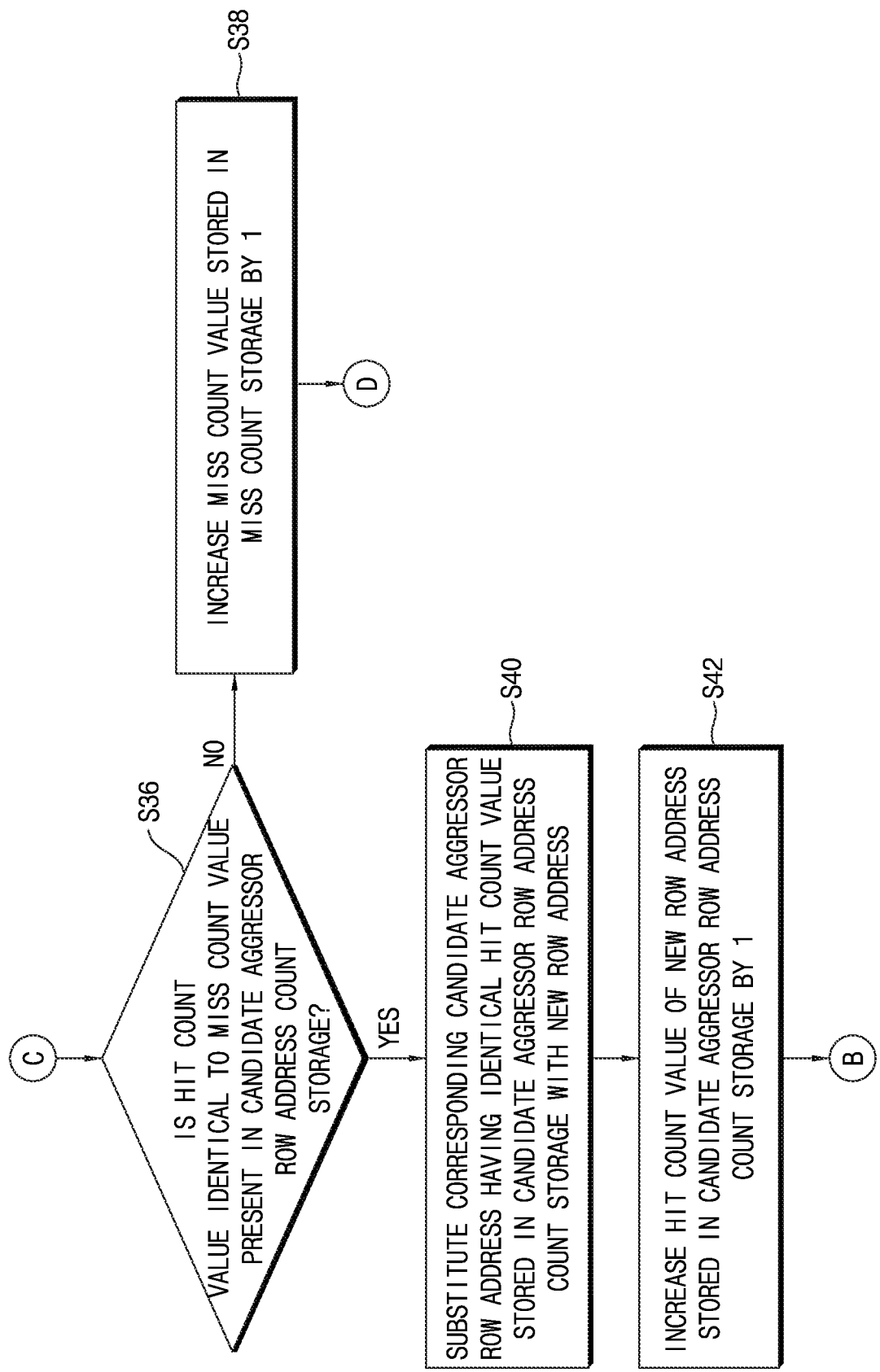

Referring to FIG. 3C, if step S28 is not satisfied, it is determined whether a hit count value hcnt1, hcnt2, . . . , or hcntn identical to a miss count value mcnt is present in the candidate aggressor row address count storage 4 (S36). That is, it is determined whether the miss count value mcnt is identical to one among the hit count values hcnt1 to hcntn in the candidate aggressor row address count storage 4. If step S36 is satisfied, a candidate aggressor row address cara1, cara2, . . . , or caran having the hit count value hcnt1, hcnt2, or hcntn identical to the miss count value mcnt stored in the candidate aggressor row address count storage 4 is substituted with (i.e., replaced by) the new row address RADD (S40). That is, an operation of substituting the row address RADD for the candidate aggressor row address whose corresponding hit count value is identical to the miss count value, is performed. After step S40, the hit count value hcnt1 hcnt2, . . . , or hcntn of the new row address RADD (that is, the new candidate aggressor row address cara1, cara2, . . . , or caran) stored in the candidate aggressor row address count storage 4 is increased by 1 (S42). Further, the miss count value mcnt stored in the miss count storage 6 may be maintained in step S42. If step S36 is not satisfied, the miss count value mcnt stored in the miss count storage 6 is increased by 1 (S38). After step S38, step S20 may be executed again. That is, when the row address RADD is applied along with the active command ACT after step S24, the control logic unit 2 may check whether a candidate aggressor row address cara1, cara2, . . . , or caran identical to the row address RADD is present in the candidate aggressor row addresses cara1 to caran, increase the miss count value mcnt by 1 when it is not present, when a hit count value hcnt1, hcnt2, . . . , or hcntn identical to the miss count value mcnt is present in the candidate aggressor row address count storage 4, substitute the corresponding candidate aggressor row address cara1, cara2, . . . , or caran having the identical hit count value hcnt1, hcnt2, . . . , or hcntn with the new row address RADD, and increase the hit count value hcnt1, hcnt2, . . . , or hcntn of the new row address RADD (i.e., the new candidate aggressor row address cara) by 1.

Figure 3D:
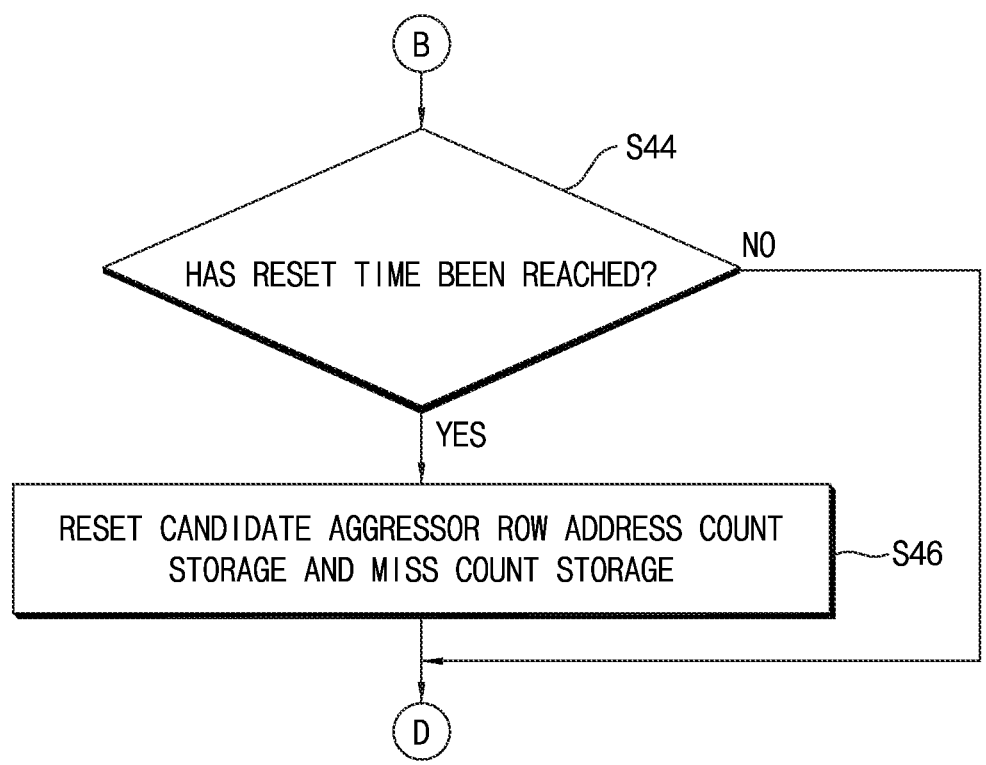

Referring to FIG. 3D, after step S42, it is determined whether a reset time at which a reset window period ends has been reached (S44). If step S44 is satisfied, the candidate aggressor row address count storage 4 and the miss count storage 6 are reset (S46). If step S44 is not satisfied or after step S46, step S20 may be executed. That is, the control logic unit 2 may reset the candidate aggressor row address count storage 4 and the miss count storage 6 when the reset time has been reached.

Figure 4A:
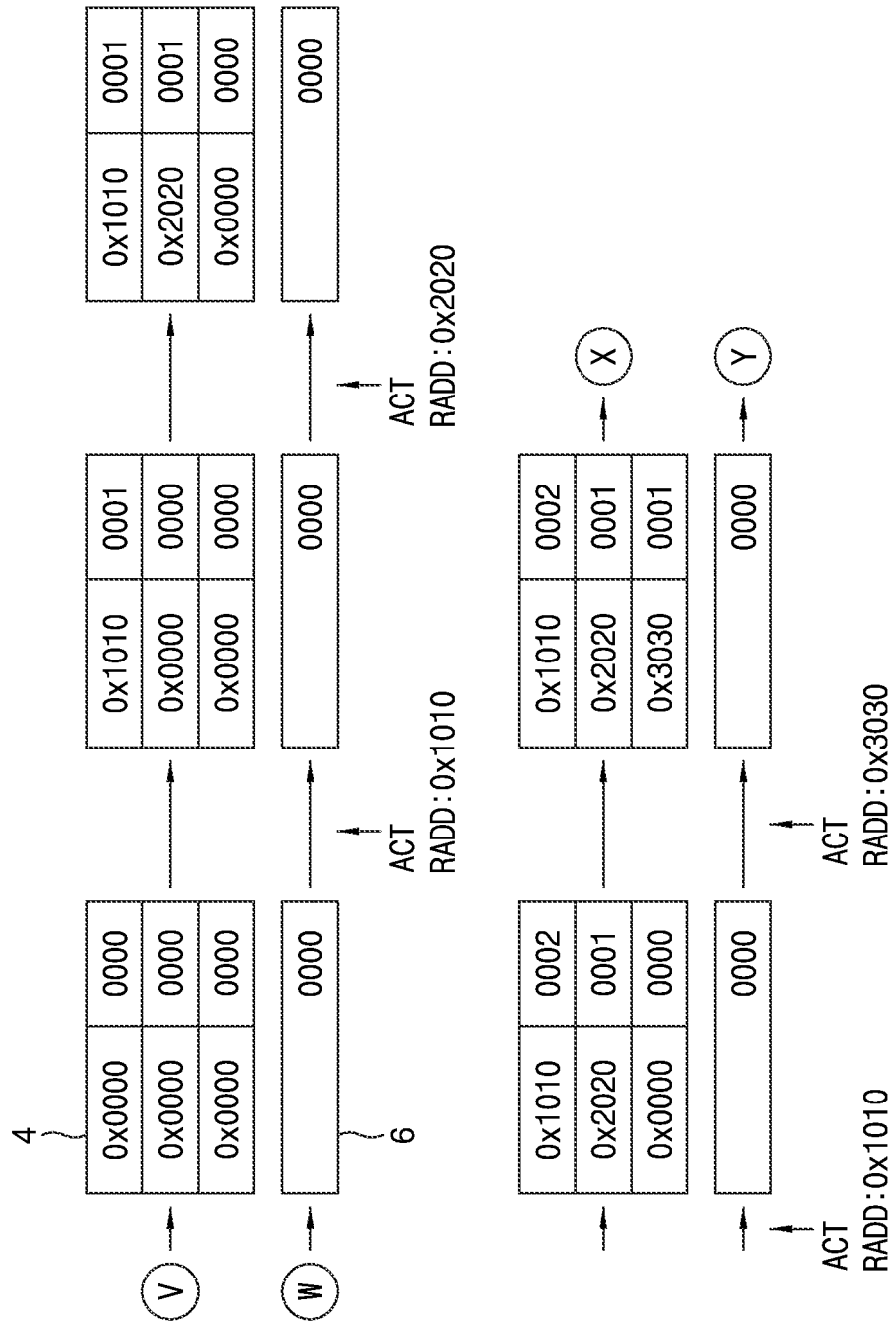
FIG. 4A and FIG. 4B show changes in candidate aggressor row addresses, hit count values, and a miss count value stored in the candidate aggressor row address count storage and the miss count storage according to the operation of the control logic unit according to the embodiment of the present disclosure.
Figure 4B:
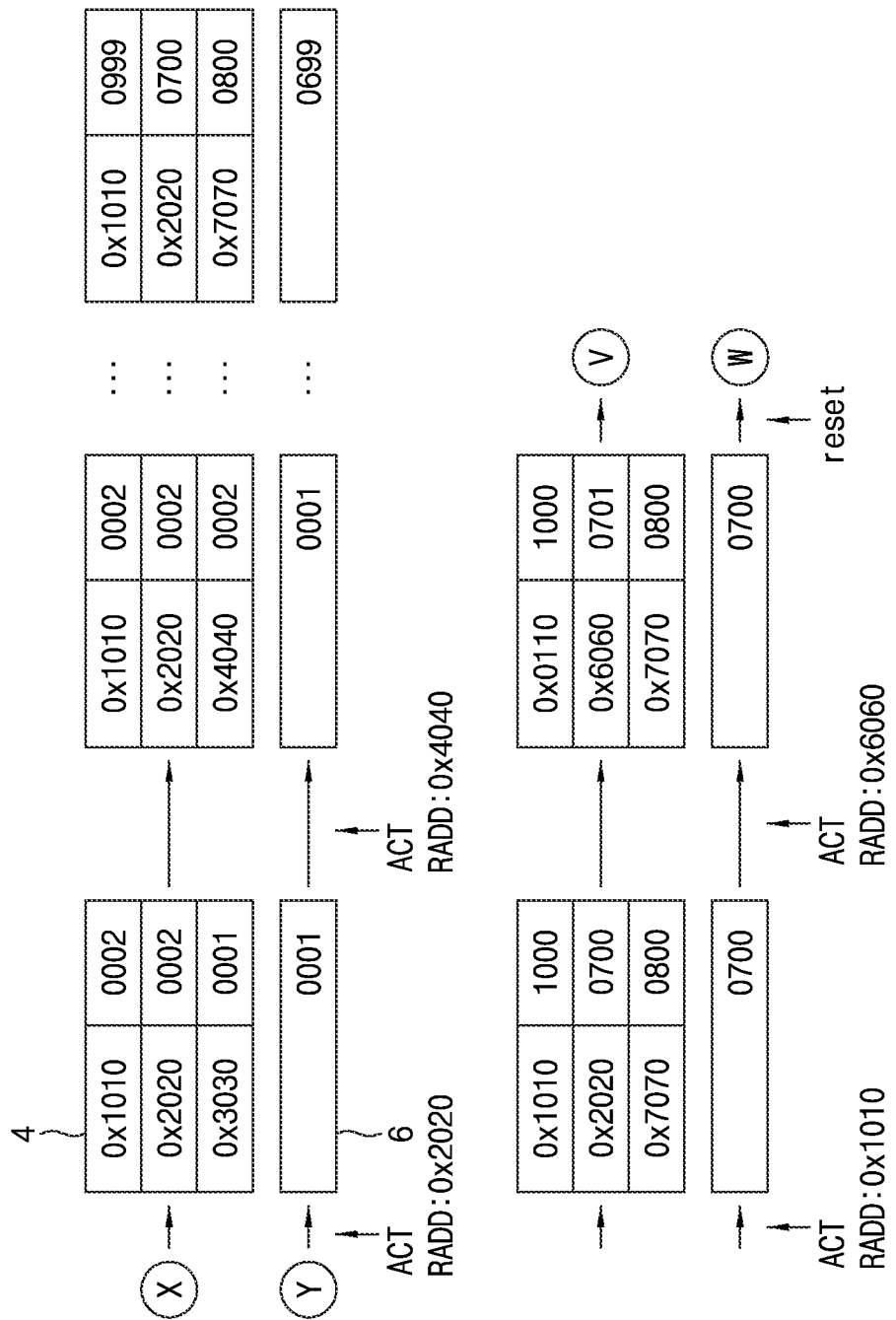

FIG. 4A and FIG. 4B show changes in candidate aggressor row addresses, hit count values, and a miss count value stored in the candidate aggressor row address count storage and the miss count storage according to the operation of the control logic unit within the embodiment of the present disclosure. FIG. 4A and FIG. 4B show an operation when the candidate aggressor row address count storage 4 includes three entries and the threshold value of hit count values hcnt1 to hcnt3 is set to "1000". Candidate aggressor row addresses cara1 to cara3 are represented in hexadecimal, and the hit count values hcnt1 to hcnt3 and the miss count value mcnt are represented in decimal.

Referring to FIG. 3A and FIG. 4A, the candidate aggressor row address count storage 4 and the miss count storage 6 may be reset. In step S20, a row address RADD of "0x0000" may be received in response to the active command ACT. In step S22, it may be determined whether the candidate aggressor row address count storage 4 is full. Since step S22 is not satisfied, step S24 may be executed and a candidate aggressor row address cara1 of "0x0000" and a hit count value hcnt1 of "0001" may be stored in the first entry of the candidate aggressor row address count storage 4. This operation may be performed until the candidate aggressor row address count storage 4 becomes full. As an embodiment, when the candidate aggressor row address count storage 4 becomes full, a candidate aggressor row address cara1 of "0x1010" and a hit count value hcnt1 of "0002" may be stored in the first entry, a candidate aggressor row address cara2 of "0x2020" and a hit count value hcnt2 of "0001" may be stored in the second entry, and a candidate aggressor row address cara3 of "0x3030" and a hit count value hcnt3 of "0001" may be stored in the third entry.

Referring to FIGS. 3A, 3B and 4B, a row address RADD of "0x2020" may be received in response to the active command ACT in step S20. It is determined whether the candidate aggressor row address count storage 4 is full in step S22, and since the candidate aggressor row address count storage 4 is full, step S26 may be executed and the candidate aggressor row addresses cara1, cara2, and cara3 stored in the candidate aggressor row address count storage 4 may be searched. Since the row address RADD of "0x2020" is found present in the second entry of the candidate aggression row address storage 4 in step S28, step S30 may be executed. In step S30, the hit count value hcnt2 of the second entry may be increased by 1 such that "0002" is stored.

Referring to FIGS. 3A to 3C and 4B, a row address RADD of "0x4040" is received in response to the active command ACT in step S20, and steps S22 and S26 may be performed. Since the row address RADD of "0x4040" is not present in the candidate aggressor row address storage 4 in step S28, step S36 may be executed. Since the hit count value hcnt3 of "0001" of the third entry of the candidate aggressor row address count storage 4 is identical to the miss count value mcnt in step S36, step S40 may be executed. The candidate aggressor row address hcnt3 of "0x3030" in the third entry of the candidate aggressor row address count storage 4 is substituted with (i.e., replaced by) "0x4040" (the new row address RADD) in step S40 and processing proceeds to step S42 in which the hit count value hcnt3 of the third entry of the candidate aggressor row address count storage 4 may be increased by 1 such that "0002" is stored. By repeatedly performing this operation, a candidate aggressor row address cara1 of "0x1010" and a hit count value hcnt1 of "0999" may be stored in the first entry of the candidate aggressor row address count storage 4, a candidate aggressor row address cara2 of "0x2020" and a hit count value hcnt2 of "0700" may be stored in the second entry, and a candidate aggressor row address cara3 of "0x7070" and a hit count value hcnt3 of "0800" may be stored in the third entry.

A row address RADD of "0x1010" is received in response to the active command ACT in step S20, and steps S22, S26, S28, and S30 may be executed and the hit count value hcnt1 of the first entry of the candidate aggressor row address count storage 4 may be increased by 1 such that "1000" may be stored. Since the hit count value hcnt1 of the first entry of the candidate aggressor row address count storage 4 is "1000" which is the threshold value in step S32, step S34 may be executed and "0x1010," which is the candidate aggressor row address cara1 of the first entry of the candidate aggressor row address count storage 4, may be determined as a target aggressor row address and one victim row address adjacent to each of both sides of the aggressor row address (aggressor row address±1, for example, 0x1011 and 0x100F) may be generated as a hammer refresh row address HRADD along with a hammer refresh command HREF. A hammer refresh operation may be performed on memory cells of the hammer refresh row address HRADD in response to the hammer refresh command HREF.

As an embodiment, when the threshold value of the hit count values hcnt1 to hcnt3 is set to "700" which is less than "1000", two victim row addresses adjacent to each of both sides of the target aggressor row address of "0x1010" (target aggressor row address±1 and aggressor row address±2, for example, 0x1011, 0x1012, 0x100F, and 0x100E) may be generated as the hammer refresh row addresses HRADD in step S34 when the threshold value of the hit count value hcnt1 of the first entry of the candidate aggressor row address count storage 4 is "700" in step S32. Similarly, when the threshold value of the hit count values hcnt1 to hcnt3 is set to "500" which is less than "1000", three victim row addresses adjacent to each of both sides of the aggressor row address of "0x1010" (target aggressor row address±1, aggressor row address±2, and aggressor row address±3, for example, 0x1011, 0x1012, 0x1013, 0x100F, 0x100E, and 0x100D) may be generated as hammer refresh row addresses HRADD in step S34 when the threshold value of the hit count value hcnt1 of the first entry of the candidate aggressor row address count storage 4 is "500" in step S32. That is, when the threshold value of a hit count value of a candidate aggressor row address is set to be smaller, not only victim row addresses (target aggressor row address±1) adjacent to an aggressor row address but also victim row addresses which are not adjacent to the aggressor row address may be generated as hammer refresh row addresses HRADD.

Thereafter, a row address RADD of "0x6060" is received in response to the active command ACT in step S20, and steps S22, S26, S28, and S36 may be executed. The candidate aggressor row address hcnt2 of "0x2020" of the second entry of the candidate aggressor row address count storage 4 is substituted with (i.e., replaced by) "0x6060" (the new row address RADD) in step S40 and step S42 may be executed so that the hit count value hcnt2 of the second entry of the candidate aggressor row address count storage 4 may be increased by 1 such that "0701" is stored.

It is determined whether the reset time has been reached in step S44, and when the reset time has been reached, step S46 may be proceeded and the candidate aggressor row address count storage 4 and the miss count storage 6 may be reset.

Figure 5:
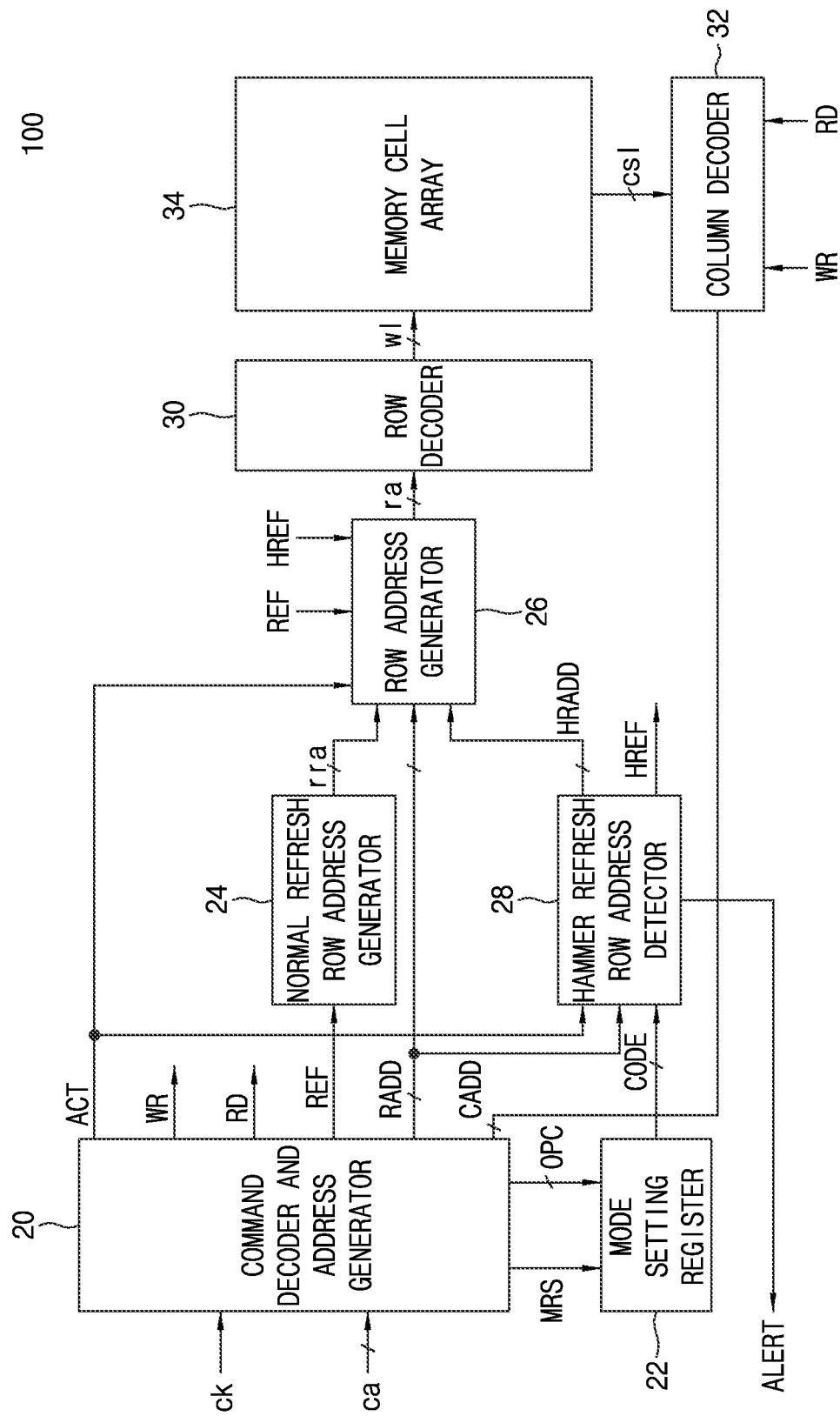
FIG. 5 is a block diagram showing a configuration of a semiconductor memory device according to an embodiment of the present disclosure.

FIG. 5 is a block diagram showing a configuration of a semiconductor memory device according to an embodiment of the present disclosure. The semiconductor memory device 100 may include a command decoder and address generator 20, a mode setting register 22, a refresh row address generator 24, a row address generator 26, a hammer refresh row address detector 28, a row decoder 30, a column decoder 32, and a memory cell array 34.

A function of each block shown in FIG. 5 will be described as follows.

The command decoder and address generator 20 may decode a command and address "ca" in response to an external clock signal "ck" to generate a mode setting command MRS, an active command ACT, a read command RD, and a write command WR. In addition, the command decoder and address generator 20 may generate an address signal included in the command and address ca as a mode setting code OPC in response to the mode setting command MRS, generate the address signal included in the command and address ca as a row address RADD in response to the active command ACT, and generate the address signal included in the command and address ca as a column address CADD in response to the read command RD or the write command WR.

The mode setting register 22 may store the mode setting code OPC and set a code value CODE in response to the mode setting command MRS. The code CODE may include at least one of a first code value related to the reset window period P, a second code value related to the total number of active commands ACT that can be applied within the reset window period P, and a third code value related to the threshold value T.

The refresh row address generator 24 may generate a normal refresh row address "rra" in response to a normal refresh command REF.

The row address generator 26 may generate a row address "ra" based on the row address RADD and in response to the active command ACT, generate a normal refresh row address ra based on the row address rra and in response to the refresh command REF, or generate a row address ra based on a hammer refresh row address HRADD and in response to the hammer refresh command HREF.

The hammer refresh row address detector 28 may set the reset window period P, the threshold value T, and the number n of entries in response to the code value CODE, receive a row address RADD in response to the active command ACT, and generate the hammer refresh command HREF and a hammer refresh row address HRADD. The hammer refresh row address detector 28 may additionally generate a warning signal ALERT along with the hammer refresh command HREF. The hammer refresh row address detector 28 may have the configuration as described above with reference to FIGS. 1 to 4B and perform a hammer refresh row address detection operation. In an embodiment, the hammer refresh row address detector 28 may have a pre-stored code value CODE.

The row decoder 30 may select at least one of a plurality of word line select signals "wl" by decoding a row address ra.

The column decoder 32 may select at least one of a plurality of column select signals "csl" by decoding a column address CADD in response to the write command WR or the read command RD.

The memory cell array 34 may include a plurality of memory cells selected by a plurality of word line select signals wl and a plurality of column select signals csl and perform a normal refresh operation on memory cells, selected in response to at least one selected word line select signal, in response to the normal refresh command REF. The memory cell array 34 may perform a hammer refresh operation on memory cells, selected in response to at least one selected word line select signal, in response to the hammer refresh command HREF. The memory cell array 34 may store data in memory cells selected by a plurality of word line select signals wl and a plurality of column select signals csl in response to the write command WR and read data from the selected memory cells in response to the read command RD.

As described above, the hammer refresh row address detector 10 of the embodiment according to the present disclosure may be included in the semiconductor memory device 100.

Figure 6:
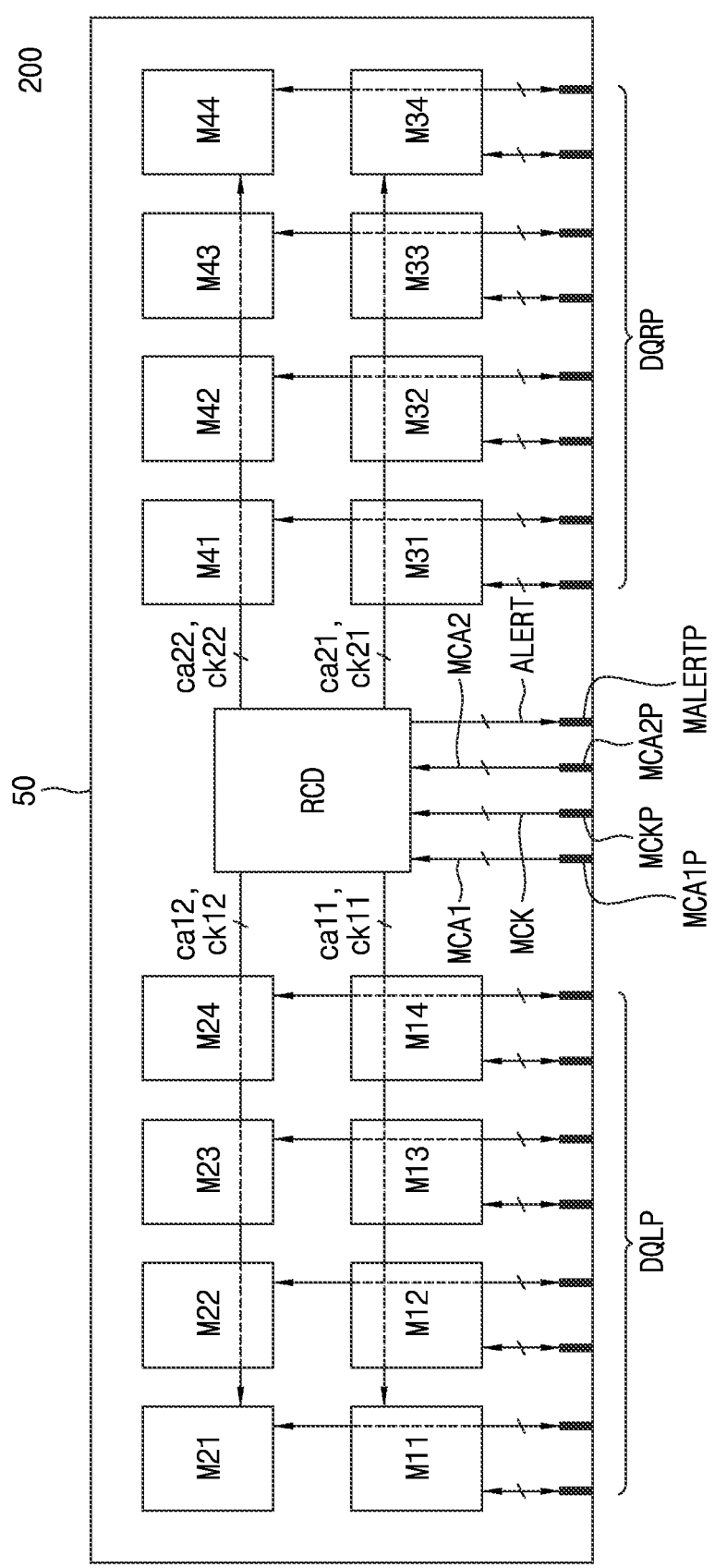
FIG. 6 is a block diagram showing a configuration of a memory module according to an embodiment of the present disclosure.

FIG. 6 is a block diagram showing a configuration of a memory module according to an embodiment of the present disclosure. The memory module 200 may include a printed circuit board 50, a plurality of (e.g., 16) semiconductor memory devices M11 to M14, M21 to M24, M31 to M34, and M41 to M44, and a register clock driver RCD.

In FIG. 6, the 16 semiconductor memory devices M11 to M14, M21 to M24, M31 to M34, and M41 to M44 and the register clock driver RCD are provided on one side (e.g., the front side) of the printed circuit board 50. DQLP represents left data terminals, DQRP represents right data terminals, MCA1P represents first module command and address terminals, MCA2P represents second module command and address terminals, MCKP represents a module clock signal terminal, and MALERTP represents a module warning signal terminal.

A function of each block shown in FIG. 6 will be described as follows.

The four first semiconductor memory devices M11 to M14 may input/output data through some of the left data terminals DQLP in response to a first clock signal ck11 and a first command/address signal ca11, and the four second semiconductor memory devices M21 to M24 may input/output data through the remaining left data terminals DQLP in response to a second clock signal ck12 and a second command/address signal ca12. The four third semiconductor memory devices M31 to M34 may input/output data through some of the right data terminals DQRP in response to a third clock signal ck21 and a third command/address signal ca21, and the four semiconductor memory devices M41 to M44 may input/output data through the remaining right data terminals DQRP in response to a fourth clock signal ck22 and a fourth command/address signal ca22.

For example, when each of the 16 semiconductor memory devices M11 to M14, M21 to M24, M31 to M34, and M41 to M44 inputs/outputs 4-bit data through four data terminals, the memory module 200 may input/output 64-bit data through 32 left data terminals DQLP and 32 right data terminals DQRP.

The register clock driver RCD may receive a first module command and address MCA1 applied through the first module command and address terminals MCA1P in response to a module clock signal MCK applied through a first module clock signal terminal MCKP; generate the first clock signal ck11, the first command and address signal ca11, the second clock signal ck12, and the second command and address signal ca12; receive a second module command and address MCA2 applied through the second module command and address terminals MCA2P in response to the module clock signal MCK applied through the first module clock signal terminal MCKP; and generate the third clock signal ck21, the third command and address signal ca21, the fourth clock signal ck22, and the fourth command and address signal ca22. When a command signal included in the first module command and address MCA1 is a first active command, the register clock driver RCD may generate an address signal included in the first module command and the address MCA1 as a first row address, receive the first active command and the first row address, and perform a hammer refresh row address detection operation with the configuration as described above with reference to FIGS. 1 to 4B. Similarly, the register clock driver RCD may receive a second module command and the address MCA2 and perform a hammer refresh row address detection operation. The register clock driver RCD may additionally generate a warning signal ALERT and output the same through the module warning signal terminal MALERTP.

Figure 7:
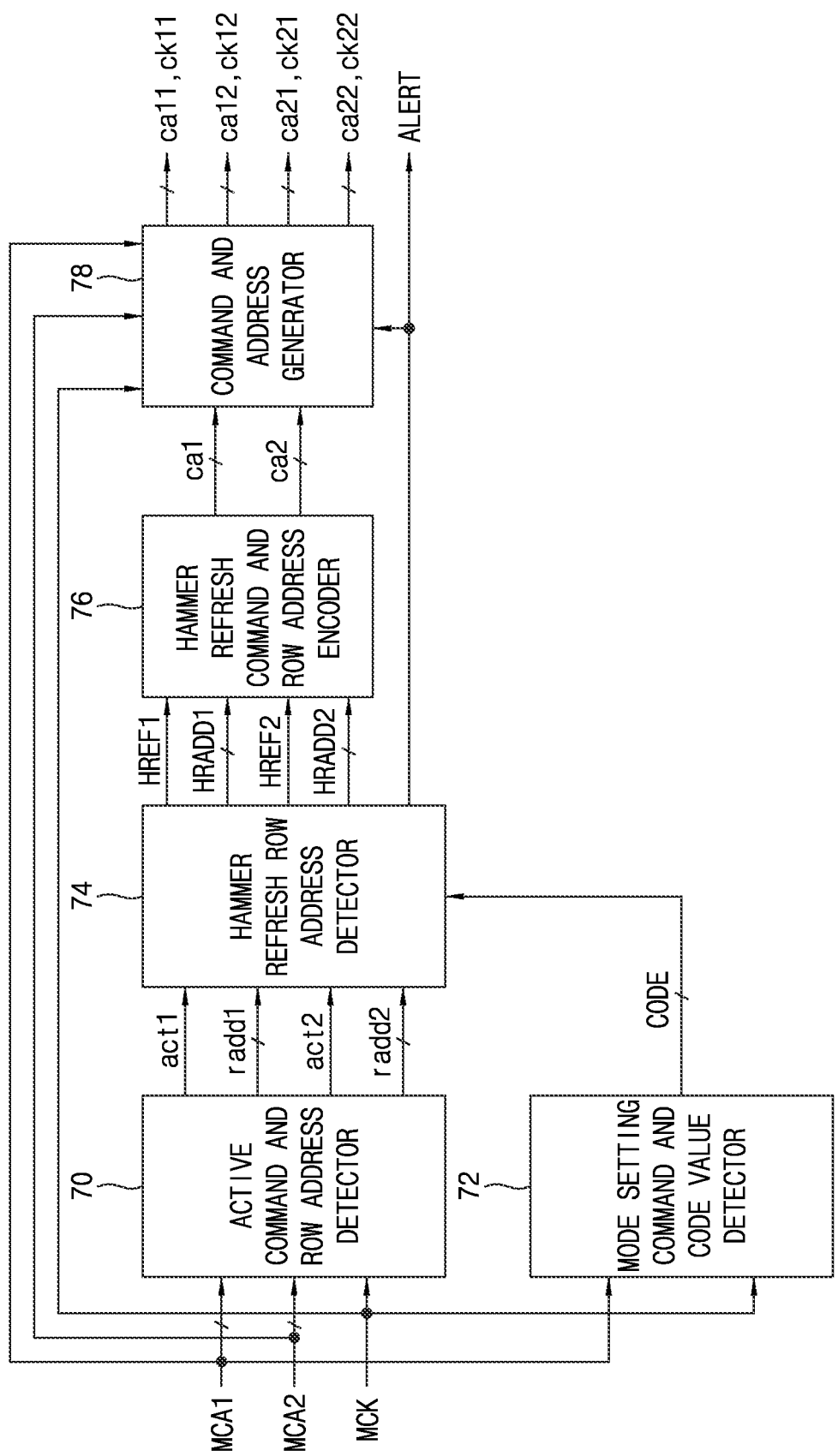
FIG. 7 is a block diagram showing a configuration of the register clock driver according to an embodiment of the present disclosure.

FIG. 7 is a block diagram showing a configuration of the register clock driver according to an embodiment of the present disclosure. The register clock driver RCD may include an active command and row address detector 70, a mode setting command and code value detector 72, a hammer refresh row address detector 74, a hammer refresh command and row address encoder 76, and a command and address generator 78.

A function of each block shown in FIG. 7 will be described as follows.

The active command and row address detector 70 may receive the first module command and address MCA1 in response to the module clock signal MCK and when a command signal included in the first module command and address MCA1 is an active command ACT, generate a first driver active command act1. The active command and row address detector 70 may generate an address signal included in the first module command and address MCA1 as a first driver row address radd1 along with the first driver active command act1. The active command and row address detector 70 may receive the second module command and address MCA2 in response to the module clock signal MCK and generate a second driver active command act2 and a second driver row address radd2.

The mode setting command and code value detector 72 may receive the first module command and address MCA1 in response to the module clock signal MCK. The mode setting command and code value detector 72 may generate a code value CODE when a mode setting code OPC included in the first module command and address MCA1 is the code value CODE and the command signal included in the first module command and address MCA1 is the mode setting command (MRS). As an embodiment, the code value CODE may be applied through another path (not shown) of the memory module 200.

The hammer refresh row address detector 74 may receive the first driver row address radd1 in response to the first driver active command act1 and generate a first hammer refresh command HREF1 and a first hammer refresh row address HRADD1 by performing a hammer refresh row address detection operation with the configuration as described above with reference to FIGS. 1 to 4B. The hammer refresh row address detector 74 may receive the second driver row address radd2 in response to the second driver active command act2 and generate a second hammer refresh command HREF2 and a second hammer refresh row address HRADD2 by performing a hammer refresh row address detection operation. As an embodiment, the hammer refresh row address detector 74 may have a pre-stored code value CODE.

The hammer refresh command and row address encoder 76 may encode the first hammer refresh command HREF1 and the first hammer refresh row address HRADD1 to generate a first driver command and address ca1. The hammer refresh command and row address encoder 76 may encode the second hammer refresh command HREF2 and the second hammer refresh row address HRADD2 to generate a second driver command and address ca2.

The command and address generator 78 may receive the first module command and address MCA1, in response to the module clock signal MCK, and generate a first clock signal ck11, a first command and address ca11, a second clock signal ck12, and a second command and address ca12. When a warning signal ALERT is generated, the command and address generator 78 may receive the first driver command and address ca1 in response to the module clock signal MCK and generate the first clock signal ck11, the first command and address ca11, the second clock signal ck12, and the second command and address ca12.

The first command and address ca11 and the second command and address ca12 may be signals having opposite phases. The command and address generator 78 may receive the second module command and address MCA2, in response to the module clock signal MCK, and generate a third clock signal ck21, a third command and address ca21, a fourth clock signal ck22, and a fourth command and address ca22. The command and address generator 78 may receive the second driver command and address ca2, in response to the warning signal ALERT, and generate the third clock signal ck21, the third command and address ca21, the fourth clock signal ck22, and the fourth command and address ca22. The third command and address ca21 and the fourth command and address ca22 may be signals having opposite phases.

Figure 8:
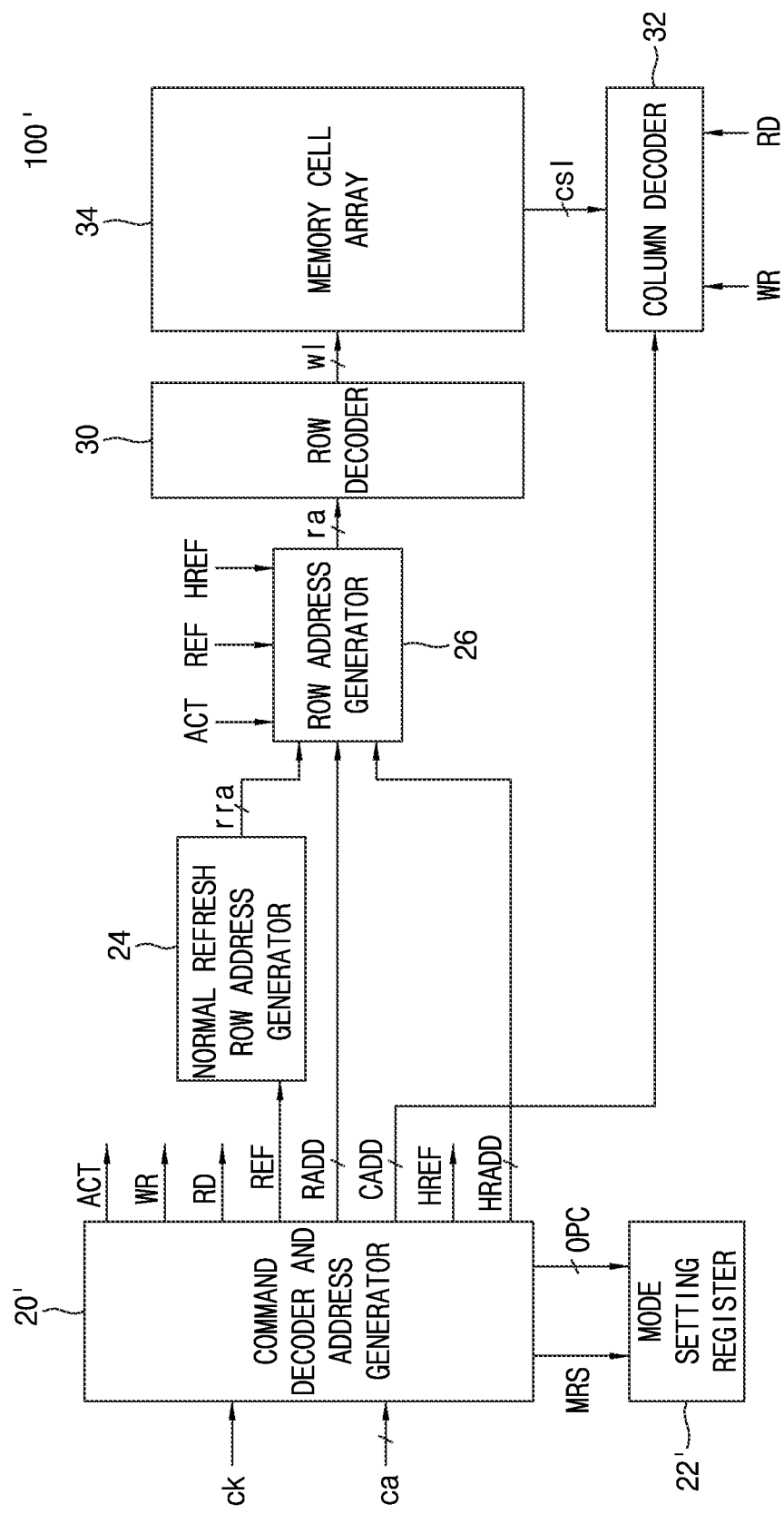
FIG. 8 is a block diagram showing a configuration of a semiconductor memory device according to an embodiment of the present disclosure.

FIG. 8 is a block diagram showing a configuration of a semiconductor memory device according to an embodiment of the present disclosure. The semiconductor memory device 100' may have a configuration in which the command decoder and an address generator 20 and the mode setting register 22 of the semiconductor memory device 100 shown in FIG. 5 are substituted with a command decoder and address generator 20' and a mode setting register 22' and the hammer refresh row address detector 28 is excluded.

Functions of the substituted blocks other than the same blocks as those shown in FIG. 5 among the blocks shown in FIG. 8 will be described as follows.

The command decoder and address generator 20' may perform the same operation as the command decoder and address generator 20 shown in FIG. 5 and additionally perform an operations of: (1) decoding a command signal included in a command and address "ca" to generate a hammer refresh command HREF and (2) generating a hammer refresh row address HRADD based on an address signal included in the command and address ca.

Unlike the mode setting register 22 shown in FIG. 5, the mode setting register 22' may not set a code value CODE.

The hammer refresh row address detector 10 of the embodiment according to the present disclosure may be included in the register clock driver RCD instead of being included in each of the 16 semiconductor memory devices M11 to M14, . . . , M41 to M44 of the memory module 200 shown in FIG. 6, as described above.

Figure 9:
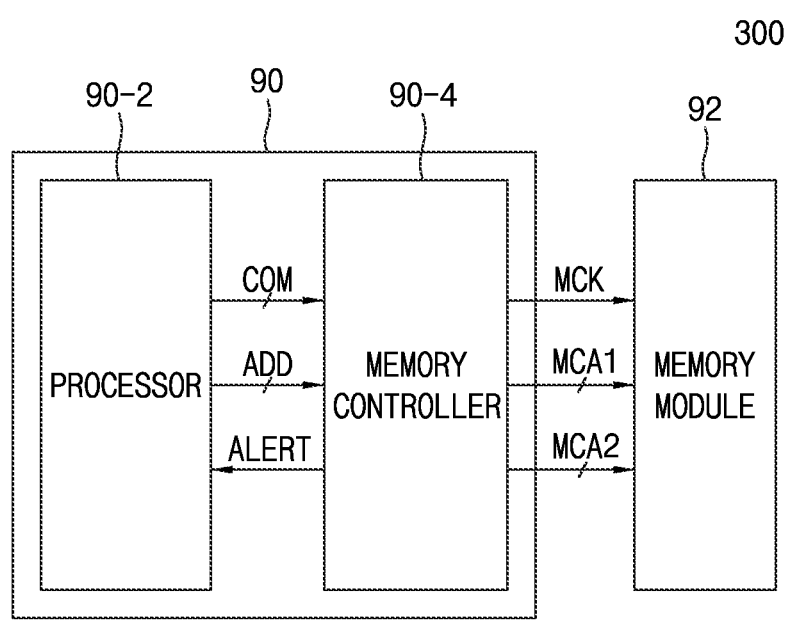
FIG. 9 is a block diagram showing a configuration of a memory system according to an embodiment of the present disclosure.

FIG. 9 is a block diagram showing a configuration of a memory system according to an embodiment of the present disclosure. The memory system 300 may include a control device 90 and a memory module 92. The control device 90 may include a processor 90-2 and a memory controller 90-4. The memory module 92 may include a plurality of semiconductor memory devices (not shown).

A function of each block shown in FIG. 9 will be described as follows.

The processor 90-2 may execute a program or an application to generate a command signal COM and an address signal ADD and may not generate the command signal COM and the address signal ADD in response to the warning signal ALERT.

The memory controller 90-4 may receive the command signal COM and the address signal ADD to generate a first module command and address MCA1 and a second module command and address MCA2. The memory controller 92 may generate a first hammer refresh command HREF1 and a first hammer refresh row address HRADD1 and generate a second hammer refresh command HREF2 and a second hammer refresh row address HRADD2 by performing a hammer refresh address detection operation with the configuration described with reference to FIGS. 1 to 4B during a reset window period. The first hammer refresh command HREF1 and the first hammer refresh row address HRADD1 may be generated as a first module command and address MCA1, and the second hammer refresh command HREF2 and the second hammer refresh row address HRADD2 may be generated as a second module command and address MCA2. Although not shown, a code value CODE may be applied from the processor 90-2.

The memory module 92 may be a memory module as shown in FIG. 6. When the memory module 92 is configured as shown in FIG. 6, the register clock driver RCD shown in FIG. 7 may not include the active command and row address detector 70, the mode setting command and code value detector 72, the hammer refresh row address detector 74, and the hammer refresh command and row address encoder 76.

In the embodiments according to the present disclosure, the term "adjacent" may mean physically adjacent to each other. That is, an adjacent row address adjacent to a row address may mean a row address for selecting a word line physically adjacent to a word line selected by the row address.

According to embodiments of the present disclosure, the semiconductor memory device and the memory module can detect candidate aggressor row addresses on the basis of a hit count value and a miss count value of a row address and perform a hammer refresh operation on at least one hammer refresh row address (victim row address) before a substantial row hammer attack occurs.

Accordingly, the reliability of the operations of the semiconductor memory device and the memory module of the embodiments according to the present disclosure can be improved.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

While the disclosure has been particularly shown and described with reference to exemplary embodiments thereof, it will be apparent to those skilled in the art that various changes in form and detail may be made without departing from the spirit and essential characteristics of the disclosure. The above embodiments are therefore to be construed in all aspects as illustrative and not restrictive.

What is claimed is:

1. A hammer refresh row address detector comprising:
    a candidate aggressor row address count storage including n entries and configured to store a candidate aggressor row address and a hit count value corresponding to the candidate aggressor row address in each of the n entries;
    a miss count storage configured to store a miss count value; and
    a control logic unit configured to:
        receive a row address applied along with an active command,
        increase the hit count value stored in a corresponding entry when the row address is present in the candidate aggressor row addresses stored in the n entries,
        determine the candidate aggressor row address stored in at least one entry in which the hit count value in the n entries is a threshold value to be a target aggressor row address,
        generate at least one victim row address adjacent to the target aggressor row address as a hammer refresh row address along with a hammer refresh command, and
        increase the miss count value when the row address is not present in the candidate aggressor row addresses stored in the n entries and the hit count value identical to the miss count value is not present in the n entries.

2. The hammer refresh row address detector according to claim 1, wherein when the row address is not present in the candidate aggressor row addresses stored in the n entries and the hit count value identical to the miss count value is present in the n entries, the control logic unit:
    substitutes the candidate aggressor row address of an entry in which the hit count value identical to the miss count value is stored among the n entries with the row address, and
    increases the hit count value of the entry in which the hit count value identical to the miss count value is stored among the n entries.

3. The hammer refresh row address detector according to claim 2, wherein when the row address is not present in the candidate aggressor row addresses stored in the n entries and the hit count value identical to the miss count value is present in the n entries, the control logic unit maintains the miss count value stored in the miss count storage.

4. The hammer refresh row address detector according to claim 2, wherein the control logic unit resets the candidate aggressor row address count storage and the miss count storage when a reset window period ends.

5. The hammer refresh row address detector according to claim 4, wherein n is greater than a value obtained by subtracting 1 from a value obtained by dividing a total number of active commands applicable within the reset window period by the threshold value, and the threshold value is less than a value at which an actual row hammer attack occurs.

6. The hammer refresh row address detector according to claim 1, wherein:
    the control logic unit additionally generates at least one victim row address non-adjacent to the target aggressor row address as the hammer refresh row address along with the hammer refresh command when the hit count value stored in the at least one entry is set to be less than the threshold value, and
    the at least one victim row address non-adjacent to the target aggressor row address is adjacent to the at least one victim row address adjacent to the target aggressor row address.

7. A semiconductor memory device comprising:
    a command decoder and address generator configured to:
        decode a command signal included in a command and address to generate an active command, and
        generate an address signal included in the command and address as a row address along with the active command;
    a hammer refresh row address detector configured to:
        receive the row address applied along with the active command,
        increase a hit count value stored in a corresponding entry when the row address is present in candidate aggressor row addresses stored in n entries,
        determine a candidate aggressor row address stored in at least one entry in which the hit count value in the n entries is a threshold value to be a target aggressor row address,
        generate at least one victim row address adjacent to the target aggressor row address as a hammer refresh row address along with a hammer refresh command, and increase a miss count value when the row address is not present in the candidate aggressor row addresses stored in the n entries and the hit count value identical to the miss count value is not present in the n entries;

a row decoder configured to decode the hammer refresh row address in response to a hammer refresh command to generate a plurality of word line select signals; and a memory cell array including a plurality of memory cells connected to a plurality of word lines and configured to perform a hammer refresh operation on memory cells connected to at least one word line selected from the plurality of word lines in response to the plurality of word line select signals.

8. The semiconductor memory device according to claim 7, wherein the hammer refresh row address detector further comprises:

a candidate aggressor row address count storage including the n entries and configured to store a candidate aggressor row address and a hit count value corresponding to the candidate aggressor row address in each of the n entries; and a miss count storage configured to store the miss count value.

9. The semiconductor memory device according to claim 8, wherein:

the hammer refresh row address detector additionally generates at least one victim row address non-adjacent to the target aggressor row address as the hammer refresh row address along with the hammer refresh command when a hit count value stored in the at least one entry is set to be less than the threshold value, and the at least one victim row address non-adjacent to the target aggressor row address is adjacent to the at least one victim row address adjacent to the target aggressor row address.

10. The semiconductor memory device according to claim 8, wherein when the row address is not present in the candidate aggressor row addresses stored in the n entries and the hit count value identical to the miss count value is present in the n entries, the hammer refresh row address detector:

substitutes the candidate aggressor row address of an entry in which the hit count value identical to the miss count value is stored among the n entries with the row address, increases the hit count value of the entry in which the hit count value identical to the miss count value is stored among the n entries, and maintains the miss count value.

11. The semiconductor memory device according to claim 10, wherein the hammer refresh row address detector additionally:

generates a warning signal when a hit count value stored in at least one of the n entries reaches a threshold value, and when a reset window period ends, resets the candidate aggressor row address count storage and the miss count storage.

12. The semiconductor memory device according to claim 11, wherein:

the reset window period is equal to or less than a time between successive normal refresh operations performed on memory cells connected to the same word line among the plurality of word lines, n is greater than a value obtained by subtracting 1 from a value obtained by dividing a total number of active commands applicable within the reset window period by the threshold value, and the threshold value is less than a value at which an actual row hammer attack occurs.

13. The semiconductor memory device according to claim 11, wherein:

the command decoder and address generator:

decodes a command signal included in the command and address to generate a mode setting command, and generates an address signal included in the command and address as a mode setting code along with the mode setting command, the semiconductor memory device further comprises a mode setting register configured to receive the mode setting code in response to the mode setting command and to set a code value, and the reset window period, n, and the threshold value are variably set by the code value.

14. A memory module comprising:

a printed circuit board;

a plurality of semiconductor memory devices mounted on the printed circuit board and configured to receive a clock signal and a command and address and to perform a hammer refresh operation when a command signal included in the command and address is a hammer refresh command and an address signal included in the command and address is a hammer refresh row address; and a register clock driver mounted on the printed circuit board and configured to receive a module clock signal and a module command and address and to generate the clock signal and the command and address, wherein the register clock driver comprises:

an active command and row address detector configured to:

receive the module clock signal and the module command and address, and when the command signal included in the module command and address is an active command, generate the address signal included in the module command and address applied along with the active command as a driver row address;

a hammer refresh row address detector configured to:

receive the driver row address applied along with the active command, increase a hit count value stored in a corresponding entry when the driver row address is present in a candidate aggressor row addresses stored in n entries, determine a candidate aggressor row address stored in at least one entry in which the hit count value in the n entries is a threshold value to be a target aggressor row address, generate at least one victim row address adjacent to the target aggressor row address as the hammer refresh row address along with the hammer refresh command, and increase a miss count value when the row address is not present in the candidate aggressor row addresses stored in the n entries and the hit count value identical to the miss count value is not present in the n entries;

a hammer refresh command and row address encoder configured to receive and encode the hammer refresh command and the hammer refresh row address to generate a driver command and address; and a command and address generator configured to:
- receive the module command and address in response to the module clock signal and to generate the clock signal and the command and address, or
- receive the driver command and address and to generate the clock signal and the command and address.

15. The memory module according to claim 14, wherein the hammer refresh row address detector further comprises:
- a candidate aggressor row address count storage including the n entries and configured to store a candidate aggressor row address and a hit count value corresponding to the candidate aggressor row address in each of the n entries; and
- a miss count storage configured to store the miss count value.

16. The memory module according to claim 15, wherein:
- the hammer refresh row address detector additionally generates at least one victim row address non-adjacent to the target aggressor row address as the hammer refresh row address along with the hammer refresh command when a hit count value stored in the at least one entry is set to be less than the threshold value, and
- the at least one victim row address non-adjacent to the target aggressor row address is adjacent to the at least one victim row address adjacent to the target aggressor row address.

17. The memory module according to claim 15, wherein when the row address is not present in the candidate aggressor row addresses stored in the n entries and the hit count value identical to the miss count value is present in the n entries, the hammer refresh row address detector:
- substitutes the candidate aggressor row address of an entry in which the hit count value identical to the miss count value is stored among the n entries with the row address,
- increases the hit count value of the entry in which the hit count value identical to the miss count value is stored among the n entries, and
- maintains the miss count value.

18. The memory module according to claim 17, wherein the hammer refresh row address detector additionally:
- generates a warning signal when a hit count value stored in at least one of the n entries reaches a threshold value, and
- when a reset window period ends, resets the candidate aggressor row address count storage and the miss count storage.

19. The memory module according to claim 18, wherein each of the plurality of semiconductor memory devices comprises:
- a command decoder and address generator configured to:
  - decode the command signal included in the command and address to generate the hammer refresh command, and
  - generate the address signal included in the command and address as the hammer refresh row address along with the hammer refresh command;
- a row decoder configured to decode the hammer refresh row address in response to the hammer refresh command to generate a plurality of word line select signals; and
- a memory cell array including a plurality of memory cells connected to a plurality of word lines and configured to perform a hammer refresh operation on memory cells connected to at least one word line selected in response to the plurality of word line select signals among the plurality of word lines, wherein:
- the reset window period is equal to or less than a time between successive normal refresh operations performed on memory cells connected to the same word line among the plurality of word lines,
- n is greater than a value obtained by subtracting 1 from a value obtained by dividing a total number of active commands applicable within the reset window period by the threshold value, and
- the threshold value is less than a value at which an actual row hammer attack occurs.

20. The memory module according to claim 19, further comprising:
- a module setting command and code value detector configured to:
  - receive the module command and address in response to the module clock signal, and
  - when a command signal included in the module command and address is a mode setting command, generate a code setting code included in the module command and address applied along with the mode setting command as a code value, and
- the reset window period, n, and the threshold value are variably set by the code value.

* * * * *